(12) United States Patent
Park et al.

(10) Patent No.: US 10,269,399 B2
(45) Date of Patent: Apr. 23, 2019

(54) CONTROLLER AND OPERATING METHOD THEREOF

(71) Applicant: SK hynix Inc., Icheon-si, Gyeonggi-do (KR)

(72) Inventors: Byoung Jun Park, Cheongju-si (KR); Seong Jo Park, Cheonan-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/911,638

(22) Filed: Mar. 5, 2018

(65) Prior Publication Data

US 2019/0035443 A1  Jan. 31, 2019

(30) Foreign Application Priority Data

Jul. 28, 2017 (KR) .................. 10-2017-0096271

(51) Int. Cl.
| | |
|---|---|
| *G11C 11/40* | (2006.01) |
| *G11C 7/22* | (2006.01) |
| *G11C 7/04* | (2006.01) |
| *G11C 11/4074* | (2006.01) |
| *G11C 5/14* | (2006.01) |
| *G11C 11/4076* | (2006.01) |
| *G11C 11/406* | (2006.01) |

(52) U.S. Cl.
CPC .............. *G11C 7/227* (2013.01); *G11C 5/147* (2013.01); *G11C 7/04* (2013.01); *G11C 11/4074* (2013.01); *G11C 11/4076* (2013.01); *G11C 11/40626* (2013.01); *G11C 2207/2281* (2013.01)

(58) Field of Classification Search
CPC ................................ G11C 11/40626
USPC ........................................ 365/212
See application file for complete search history.

(56) References Cited

U.S. PATENT DOCUMENTS

| | | | | |
|---|---|---|---|---|
| 8,737,135 | B2 * | 5/2014 | Michael ................. | G11C 16/26 365/185.01 |
| 9,082,499 | B2 * | 7/2015 | Michael ................. | G11C 16/26 |
| 9,535,620 | B2 * | 1/2017 | Kim ....................... | G06F 3/0619 |
| 9,824,767 | B1 * | 11/2017 | Mantegazza ........... | G11C 16/10 |
| 10,157,676 | B2 * | 12/2018 | Pang ....................... | G11C 16/26 |

FOREIGN PATENT DOCUMENTS

| | | |
|---|---|---|
| KR | 1020150099218 A | 8/2015 |
| KR | 1020160094676 A | 8/2016 |

* cited by examiner

*Primary Examiner* — Son L Mai
(74) *Attorney, Agent, or Firm* — William Park & Associates Ltd.

(57) ABSTRACT

A controller controls an operation of a semiconductor memory device including a plurality of memory blocks. The controller includes a temperature sensing unit, a period storage unit, and a command generating unit. The temperature sensing unit generates temperature information by sensing a temperature of the semiconductor memory device. The period storage unit updates an output period of a dummy read command that allows the semiconductor memory device to perform a dummy read operation, based on the temperature information. The command generating unit generates the dummy read command, based on the output period.

19 Claims, 12 Drawing Sheets

CONTROLLER AND OPERATING METHOD THEREOF

CROSS-REFERENCE TO RELATED APPLICATION

The present application claims priority under 35 U.S.C. § 119(a) to Korean patent application number 10-2017-0096271 filed on Jul. 28, 2017 in the Korean Intellectual Property Office, the entire disclosure of which is incorporated herein by reference.

BACKGROUND

1. Technical Field

An aspect of the present disclosure relates to an electronic device, and more particularly, to a controller that controls an operation of a semiconductor memory device and an operating method of the controller.

2. Related Art

Memory devices may be formed in a two-dimensional structure in which strings are arranged horizontally to a semiconductor substrate, or formed in a three-dimensional structure in which strings are arranged vertically to a semiconductor substrate. A three-dimensional semiconductor device is a memory device devised in order to overcome the limit of degree of integration in two-dimensional semiconductor devices, and may include a plurality of memory cells vertically stacked on a semiconductor substrate.

SUMMARY

Embodiments provide a controller capable of improving the operational reliability of a semiconductor memory device.

Embodiments also provide an operating method of a controller capable of improving the operational reliability of a semiconductor memory device.

According to an aspect of the present disclosure, there is provided a controller that controls an operation of a semiconductor memory device including a plurality of memory blocks, the controller including: a temperature sensing unit configured to generate temperature information by sensing a temperature of the semiconductor memory device; a period storage unit configured to update an output period of a dummy read command that allows the semiconductor memory device to perform a dummy read operation, based on the temperature information; and a command generating unit configured to generate the dummy read command, based on the output period.

According to an aspect of the present disclosure, there is provided a method for operating a controller that controls an operation of a semiconductor memory device including a plurality of memory blocks, the method including: receiving temperature sensing information indicating a temperature of the semiconductor memory device; and updating an output period of a dummy read command for performing a dummy read operation of the semiconductor memory device, based on the temperature sensing information.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
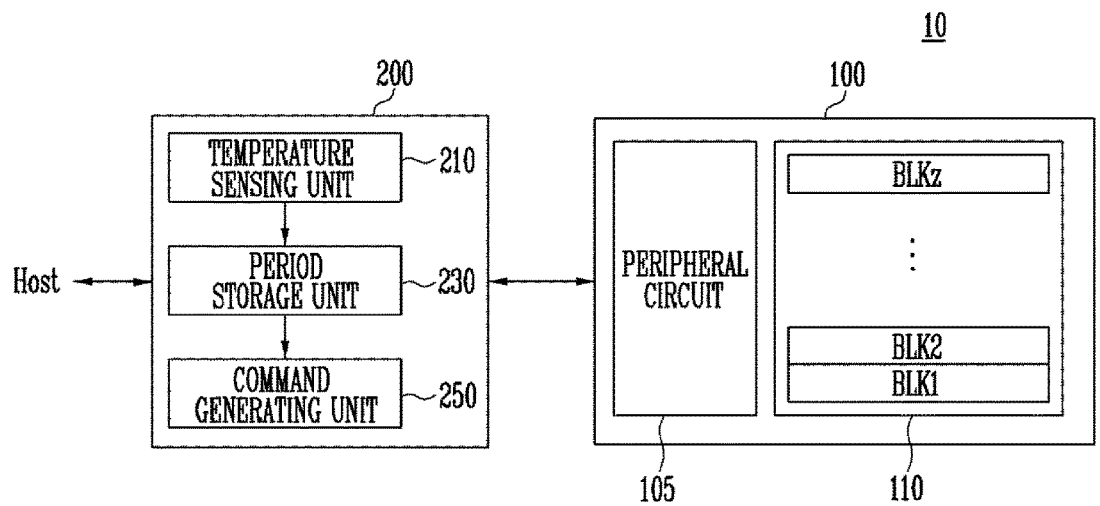
FIG. 1 is a block diagram illustrating a memory system including a controller and a semiconductor memory device according to an embodiment of the present disclosure.

In the following detailed description, only certain example embodiments of the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Hereinafter, example embodiments of the present disclosure will be described in detail with reference to the accompanying drawings. The same reference numerals are used to designate the same elements as those shown in other drawings. In the following descriptions, only portions necessary for understanding operations according to the example embodiments may be described, and descriptions of the other portions may be omitted so as to not obscure important concepts of the embodiments.

FIG. 1 is a block diagram illustrating a memory system including a controller and a semiconductor memory device according to an embodiment of the present disclosure.

Referring to FIG. 1, the memory system 10 includes a semiconductor memory device 100 and a controller 200.

The semiconductor memory device 100 operates in response to control of the controller 200. The semiconductor memory device 100 includes a memory cell array 110 and a peripheral circuit 105 for driving the memory cell array 110. The memory cell array 110 includes a plurality of memory blocks BLK1 to BLKz. Each of the plurality of memory blocks BLK1 to BLKz includes a plurality of nonvolatile memory cells.

In an embodiment, each memory block may include single level cells or include multi-level cells. Each of the memory cells included in a portion of the plurality of memory blocks BLK1 to BLKz may be defined as a single level cell that stores one bit of data. The single level cell stores one bit of data per memory cell. Each of the memory cells included in another portion of the plurality of memory blocks BLK1 to BLKz may be defined as a multi-level cell that stores multiple bits of data. The multi-level cell stores multiple bits of data per memory cell. For example, the multi-level cell may store two bits of data per memory cell. In another embodiment, each memory block may include memory cells that each stores three or more bits of data.

The peripheral circuit 105 is coupled to the memory cell array 110. The peripheral circuit 105 operates in response to control of the controller 200. The peripheral circuit 105 is configured to program data in the memory cell array 110, read data from the memory cell array 110, and erase data of the memory cell array 110, in response to control of the controller 200.

In an embodiment, read and program operations of the semiconductor memory device may be performed in units of logical pages. An erase operation of the semiconductor memory device 100 may be performed in units of memory blocks.

In a program operation, the peripheral circuit 105 may receive write data and a physical address from the controller 200. One memory block and one physical page included in the memory cell array 110 may be specified by the physical address. A logical page in the corresponding physical page may be specified by the physical address. The peripheral circuit 105 may program write data in the corresponding page. For example, write data may be stored as least significant bits of the corresponding physical page. In another example, write data may be stored as most significant bits of the corresponding physical page.

In a read operation, the peripheral circuit 105 may receive a physical address from the controller 200. One memory block and one physical page included in the memory cell array 110 may be specified by the physical address. A logical page in the corresponding physical page may be specified by the physical address. The peripheral circuit 105 may read least significant bits or most significant bits from the corresponding physical page, and output the read data to the controller 200.

In an erase operation, a physical address transmitted from the controller 200 to the peripheral circuit 105 may specify one memory block. The peripheral circuit 105 may erase data of the memory block corresponding to the physical address. In an embodiment, the erase operation is not performed in units of memory blocks but may be performed in page units. In this case, a physical page to be erased may be specified by the physical address transmitted from the controller 200 to the peripheral circuit 105. The peripheral circuit 105 may erase data of the physical page corresponding to the physical address.

In an embodiment, the semiconductor memory device 100 may be a flash memory device.

The controller 200 controls overall operations of the semiconductor memory device 100. The controller 200 is configured to access the semiconductor memory device 100 in response to a request from a host Host. For example, the controller 200 is configured to control read, write, erase, and background operations of the semiconductor memory device 100. The controller 200 is configured to provide an interface between the semiconductor memory device 100 and the host Host. The controller 200 is configured to drive firmware for controlling the semiconductor memory device 100.

The controller 200 includes a temperature sensing unit 210, a period storage unit 230, and a command generating unit 250. The temperature sensing unit 210 generates temperature information by sensing a temperature of the semiconductor memory device 100. The period storage unit 230 updates an output period of a dummy read command for allowing the semiconductor memory device 100 to perform a dummy read operation, based on the temperature information. The command generating unit 250 generates the dummy read command, based on the output period. The generated dummy read command is transmitted to the semiconductor memory device 100, so that the dummy read operation is performed.

If the memory blocks BLK1 to BLKz of the semiconductor memory device 100 are programmed, a threshold voltage of a transistor constituting each memory cell may decrease as time elapses according to a retention characteristic of the memory cell. Such a drop in the threshold voltage degrades read accuracy when a corresponding memory cell is read, and accordingly, performance of the entire memory system is deteriorated. In addition, the retention characteristic is considerably influenced by a temperature of the memory cell. For example, when a temperature of the memory cell is high, electrons trapped in a charge storage layer of the memory cell are more easily released to a channel layer, and accordingly, there is a high tendency that the threshold voltage drops. On the contrary, when the temperature of a memory cell is low, the trapped electrons are not easily released, and accordingly, there is less tendency that the threshold voltage will drop. The change in threshold voltage will be described later with reference to FIGS. 6 and 7.

The controller 200 according to the present disclosure senses a temperature of the semiconductor memory device 100, and controls the frequency of a dummy read operation performed by the semiconductor memory device 100, based on the sensed result. Accordingly, the semiconductor memory device 100 performs a dummy read operation optimized to a temperature of the device 100. Thus, a threshold voltage distribution can be maintained similar to a threshold voltage distribution of an initial program state regardless of retention characteristics of the memory cells, so that the performance of a read operation of the semiconductor memory device 100 is improved. As a result, the performance of the entire memory system 10 can be improved. The process of maintaining a threshold voltage distribution according to a dummy read operation will be described later with reference to FIGS. 8 to 10.

The temperature sensing unit 210 senses a temperature of the semiconductor memory device 100. In FIG. 1, it is schematically illustrated that the temperature sensing unit 210 is included in the controller 200. In some embodiments, the temperature sensing unit 210 may be disposed at a position physically close to the memory cell array 110 of the semiconductor memory device 100. The temperature sensing unit 210 senses a temperature of the memory cell array 110, and transmits the sensed temperature to the period storage unit 230.

The period storage unit 230 may store an output period corresponding to each temperature range in a lookup table, where the lookup table may be included in the period storage unit 230. In this case, the lookup table may store information shown in the following Table 1.

TABLE 1

| Temperature range (° C.) | Output period |
|---|---|
| −30 or lower | T1 |
| −30~−10 | T2 |
| −10~10 | T3 |
| 10~30 | T4 |
| 30~50 | T5 |
| 50~70 | T6 |
| 70 or higher | T7 |

In Table 1, there are shown a total of seven temperature ranges and output periods corresponding thereto. However, Table 1 is illustrative, and the number of temperature ranges and the size of each range may be variously determined. In general, electrons stored in a charge storage layer of a memory cell are more easily released to a channel layer as the temperature of the memory cell increases. Accordingly, as the temperature of the memory cell increases, the threshold voltage of the memory cell more easily decreases. In order to solve this, the period storage unit 230 of the controller 200 according to the present disclosure may determine a shorter output period as the temperature of the memory cell array 110 increases, where the output period is a period in which the dummy read command is generated. In other words, as temperature measured by the temperature sensing unit 210 increases, the period storage unit 230 may shorten the output period.

That is, in Table 1, output period T1 may have the longest value, output periods T2 to T6 may have values that gradually decrease from the output period T2 to the output period T6, and output period T7 may have the shortest value.

However, the configuration in which the output period of the dummy read command decreases as the temperature increases is illustrative, and the present disclosure is not limited thereto. For example, if necessary, the output period of the dummy read command may be set to increase as the temperature increases. In this case, in Table 1, the output period T1 may have the shortest value, the output periods T2 to T6 may have values that gradually increase from the output period T2 to the output period T6, and the output period T7 may have the longest value.

In the above, there is described an embodiment in which a tendency according to a change in temperature is exhibited in the output period, such as that the output period of the dummy read command becomes shorter or longer as the temperature increases. However, the present disclosure is not limited thereto, and no tendency may be exhibited between the output periods T1 to T7 of the dummy read command according to each temperature range. For example, while the output period T2 has a value longer than that of the output period T1, the output period T3 may have a value shorter than that of the output period T2. That is, the output periods T1 to T7 according to the respective temperature ranges may have various values, if necessary. In addition, a specific tendency may exist between the output periods T1 to T7, and an optimum output period may be calculated and applied in each temperature range, regardless of tendencies. Optimum values of the output periods may be experimentally determined.

The period storage unit 230 updates an output period according to temperature information received from the temperature sensing unit 210 with reference to the lookup table as shown in Table 1, and transmits the updated output period to the command generating unit 250. For example, when a current temperature is −3° C., the period storage unit 230 updates the output period T3 as a current output period, and transmits the updated output period to the command generating unit 250. When the temperature of the memory cell array 110 becomes 11° C., the period storage unit 230 updates the current output period as output period T4, and transmits the updated output period to the command generating unit 250.

The command generating unit 250 generates a dummy read command, based on the updated output period. To this end, it is necessary to refer to a time when a preceding dummy read command was generated. The preceding read command refers to the most recently generated read command. Thus, if read command A is generated and read command B is generated after read command A, then the preceding read command only refers to read command B. The command generating unit 250 generates the dummy read command by comparing an output reference time with the updated output period, where the output reference time indicates a period between a current time and the time when the preceding dummy read command was generated. When the output reference time exceeds the output period, the command generating unit 250 may generate the dummy read command as a comparison result. When the output reference time does not exceed the output period, the command generating unit 250 does not generate the dummy read command as a comparison result. Because the output period is updated based on the temperature information generated from the temperature sensing unit 210, the generation period of the dummy read command is consequently determined by a temperature of the memory cell array 110. For example, while the temperature of the memory cell array 110 is in a range of 10° C. to 30° C., the command generating unit 250 generates the dummy read command with output period T4. While the temperature of the memory cell array 110 increases to a range of 30° C. to 50° C., the command generating unit 250 generates the dummy read command with an output period T5 which is shorter than the output period T4.

The dummy read command generated from the command generating unit 250 is transmitted to the semiconductor memory device 100. Accordingly, the semiconductor memory device 100 performs a dummy read operation on the memory cell array 110 for every output period corresponding to a temperature. For example, while the temperature of the memory cell array 110 is in a range of 10° C. to 30° C., the semiconductor memory device 100 performs a dummy read operation with output period T4 which is determined according to the dummy read command generated for the output period T4. While the temperature of the memory cell array 110 increases to a range of 30° C. to 50° C., the semiconductor memory device 100 performs a dummy read operation for output period T5 shorter than output period T4 according to the dummy read command.

A specific operation of the controller 200 according to an embodiment of the present disclosure will be described in detail later with reference to FIGS. 6 to 15.

Figure 2:
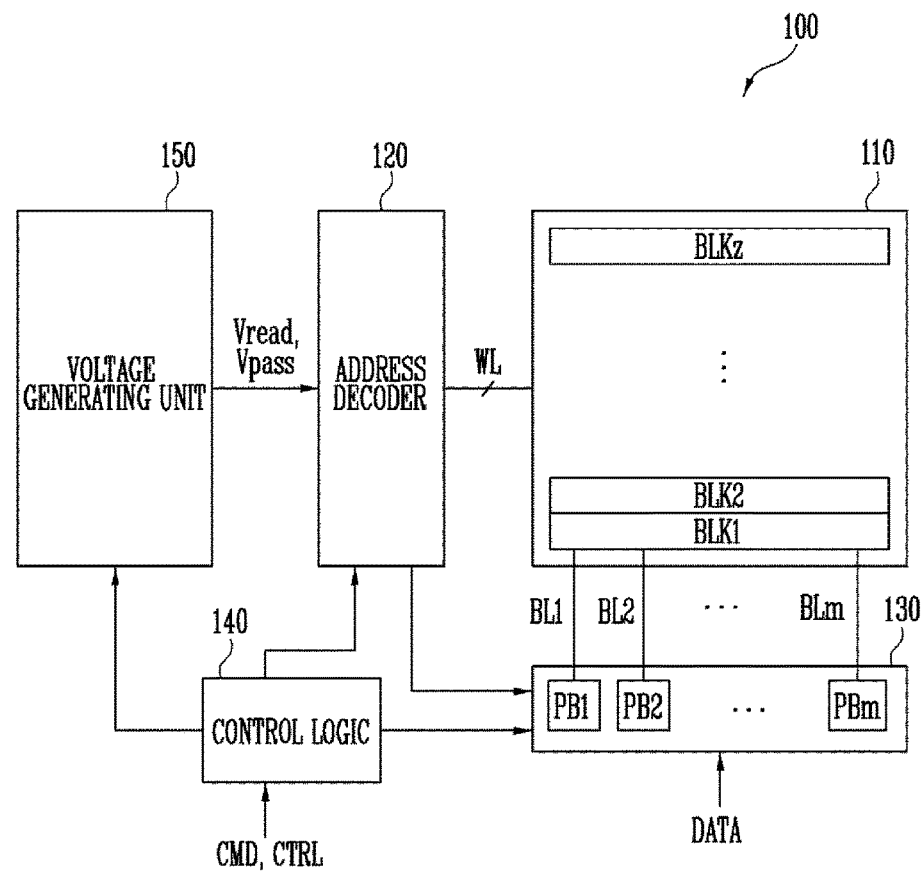
FIG. 2 is a block diagram illustrating an example embodiment of the semiconductor memory device included in the memory system of FIG. 1.

FIG. 2 is a block diagram illustrating an example embodiment of the semiconductor memory device included in the memory system of FIG. 1.

Referring to FIG. 2, the semiconductor memory device 100 includes a memory cell array 110, an address decoder 120, a read/write circuit 130, a control logic 140, and a voltage generating unit 150.

The memory cell array 110 includes a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130 through bit lines BL1 to BLm. Each of the plurality of memory blocks BLK1 to BLKz includes a plurality of memory cells. In an embodiment, the plurality of memory cells are nonvolatile memory cells, and may be configured as nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Each of the plurality of memory cells included in the memory cell array 110 may store at least one bit of data. In an embodiment, each of the plurality of memory cells included in the memory cell array 110 may be a single-level cell (SLC) that stores one bit of data. In another embodiment, each of the plurality of memory cells included in the memory cell array 110 may be a multi-level cell (MLC) that stores two bits of data. In still another embodiment, each of the plurality of memory cells included in the memory cell array 110 may be a triple-level cell that stores three bits of data. In still another embodiment, each of the plurality of memory cells included in the memory cell array 110 may be a quad-level cell that stores four bits of data. In some embodiments, the memory cell array 110 may include a plurality of memory cells that each stores five or more bits of data.

The address decoder 120, the read/write circuit 130, the control logic 140, and the voltage generating unit 150 operate as a peripheral circuit that drives the memory cell array 110. The peripheral circuit may correspond to the peripheral circuit 105 described with reference to FIG. 1. The address decoder 120 is coupled to the memory cell array 110 through the word lines WL. The address decoder 120 is configured to operate in response to control of the control logic 140. The address decoder 120 receives an address through an input/output buffer (not shown) provided in the semiconductor memory device 100.

The address decoder 120 is configured to decode a block address in the received address. The address decoder 120 selects at least one memory block according to the decoded block address. In a read voltage application operation during a read operation, the address decoder 120 applies a read voltage Vread generated by the voltage generating unit 150 to a selected word line among the selected memory blocks, and applies a pass voltage Vpass to unselected word lines. In a program verify operation, the address decoder 120 applies a verify voltage generated by the voltage generating unit 150 to the selected word line among the selected memory blocks, and applies the pass voltage Vpass to the unselected word lines.

The address decoder 120 is configured to decode a column address in the received address. The address decoder 120 transmits the decoded column address to the read/write circuit 130.

Read and program operations of the semiconductor memory device 100 are performed in page units. An address received in a read operation request and the program operation includes a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The read/write circuit 130 may operate as a "read circuit" in a read operation of the memory cell array 110, and may operate as a "write circuit" in a write operation of the memory cell array 110. The plurality of page buffers PB1 to PBm are coupled to the memory cell array 110 through the bit lines BL1 to BLm. In order to sense threshold voltages of memory cells in a read operation or a program verify operation, the plurality of page buffers PB1 to PBm sense a change in an amount of current flowing depending on a program state of a corresponding memory cell while continuously supplying sensing current to bit lines coupled to the memory cells and latches the sensed change as sensing data. The read/write circuit 130 operates in response to page buffer control signals output from the control logic 140.

In a read operation, the read/write circuit 130 arbitrarily stores read data by sensing data of a memory cell and then outputs data DATA to the input/output buffer (not shown) of the semiconductor memory device 100. In an example embodiment, the read/write circuit 130 may include a column selection circuit, and the like, in addition to the page buffers (or page registers).

The control logic 140 is coupled to the address decoder 120, the read/write circuit 130, and the voltage generating unit 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. Also, the control logic 140 outputs a control signal for controlling sensing node precharge potential levels of the plurality of page buffers PB1 to PBm. The control logic 140 may control the read/write circuit 130 to perform a read operation of the memory cell array 110.

In the read operation, the voltage generating unit 150 generates the read voltage Vread and the pass voltage Vpass in response to a voltage generating unit control signal output from the control logic 140.

The semiconductor memory device 100 may perform a dummy read operation by receiving a dummy read command from the controller 200. The dummy read operation is not an operation for outputting data stored in an actual memory cell but an operation for compensating for a threshold voltage drop according to a retention characteristic of the memory cell. The dummy read operation may be performed on all of the plurality of memory blocks BLK1 to BLKz in the memory cell array 110, or may be performed on only some memory blocks among the plurality of memory blocks BLK1 to BLKz. The dummy read operation will be described in detail later with reference to FIGS. 6 to 9.

Figure 3:
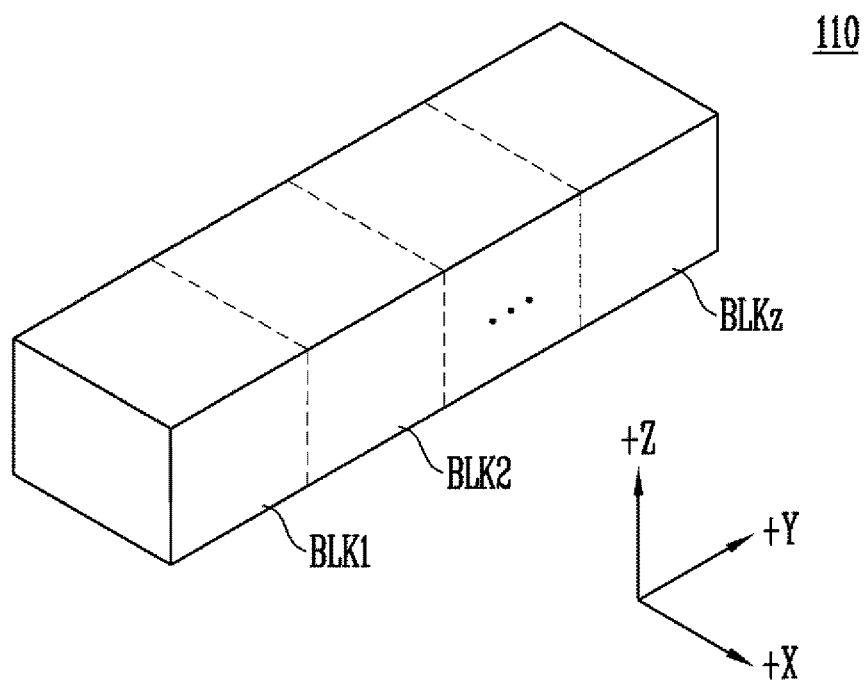
FIG. 3 is a block diagram illustrating an embodiment of a memory cell array of FIG. 2.

FIG. 3 is a block diagram illustrating an embodiment of the memory cell array of FIG. 2.

Referring to FIG. 3, the memory cell array 110 includes a plurality of memory blocks BLK1 to BLKz. Each memory block has a three-dimensional structure. Each memory block includes a plurality of memory cells stacked above a substrate. The plurality of memory cells are arranged along +X, +Y, and +Z directions. The structure of each memory block configured in the three-dimensional structure will be described in more detail with reference to FIGS. 4 and 5. Meanwhile, unlike each memory block shown in FIG. 3, each memory block of the memory cell array 110 may have a two-dimensional structure.

Figure 4:
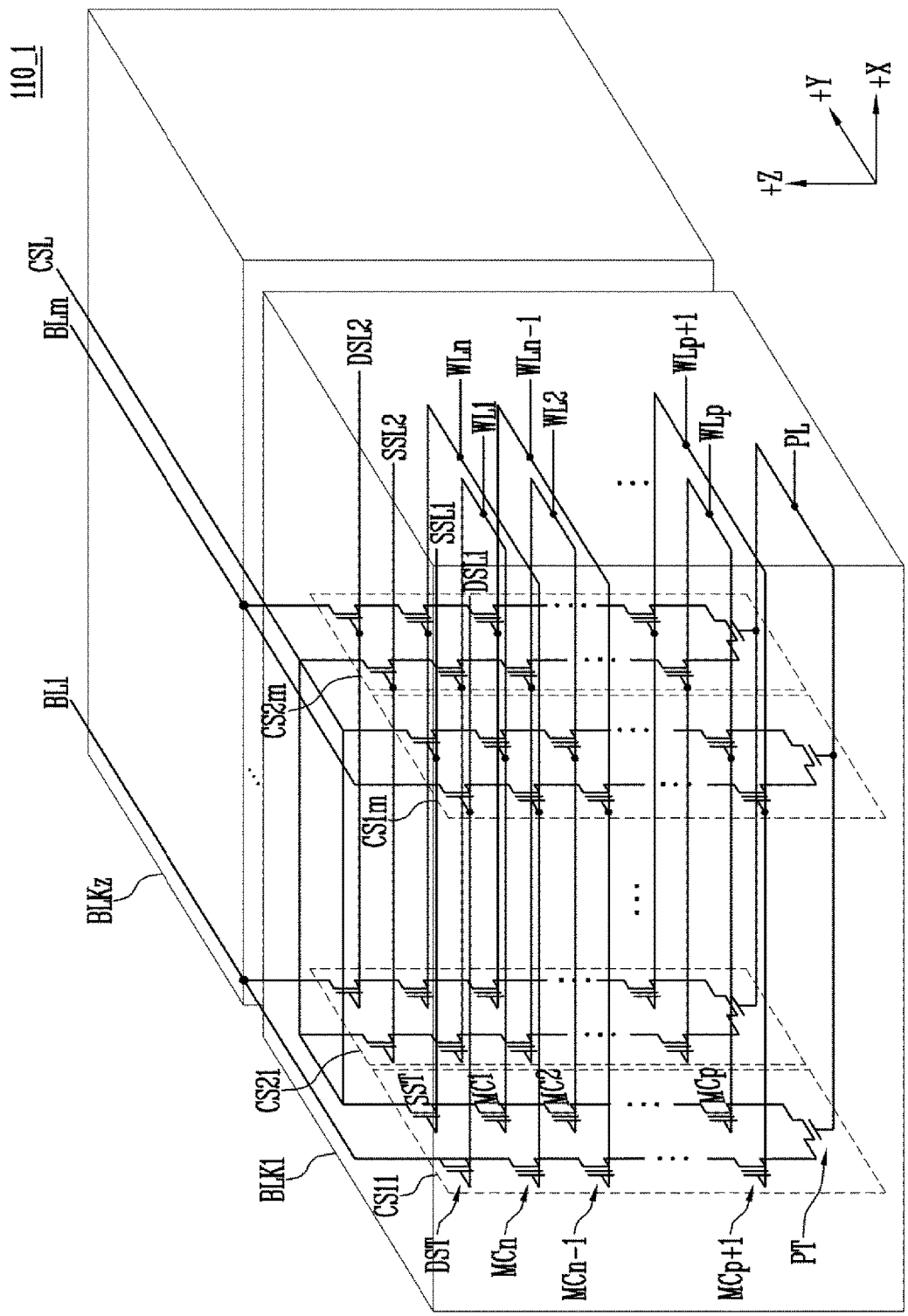
FIG. 4 is a diagram illustrating an embodiment of the memory cell array of FIG. 2.

FIG. 4 is a diagram illustrating an embodiment 110_1 of the memory cell array 110 of FIG. 2.

Referring to FIG. 4, the memory cell array 110_1 includes a plurality of memory blocks BLK1 to BLKz. In FIG. 4, for convenience of description, an internal configuration of a first memory block BLK1 is illustrated, and internal configurations of the other memory blocks BLK2 to BLKz are omitted. It will be understood that second to zth memory blocks BLK2 to BLKz may be configured identically to the first memory block BLK1.

Referring to FIG. 4, the first memory block BLK1 includes a plurality of cell strings CS11 to CS1*m* and CS21 to CS2*m*. In an embodiment, each of the plurality of cell strings CS11 to CS1*m* and CS21 to CS2*m* may be formed in a 'U' shape. In the first memory block BLK1, m cell strings are arranged in a row direction (i.e., a +X direction). In FIG. 4, it is illustrated that two cell strings are arranged in a column direction (i.e., a +Y direction). However, this is for convenience of description, and it will be understood that three cell strings may be arranged in the column direction.

Each of the plurality of cell strings CS11 to CS1*m* and CS21 to CS2*m* includes at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged in the same row are coupled to a source select line extending in the row direction, and the source select transistors of cell strings arranged in different rows are coupled to different source select lines. In FIG. 4, the source select transistors of the cell strings CS11 to CS1*m* in a first row are coupled to a first source select line SSL1. The source select transistors of the cell strings CS21 to CS2*m* in a second row are coupled to a second source select line SSL2.

In another embodiment, the source select transistors of the cell strings CS11 to CS1*m* and CS21 to CS2*m* may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1*m* in the first row are coupled to a first drain select line DSL1. The drain select transistors of the cell strings CS21 to CS2*m* in the second row are coupled to a second drain select line DSL2.

Cell strings arranged in the column direction are coupled to a bit line extending in the column direction. In FIG. 4, the cell strings CS11 and CS21 in a first column are coupled to a first bit line BL1. The cell strings CS1*m* and CS2*m* in an mth column are coupled to an mth bit line BLm.

Memory cells coupled to the same word line in the cell strings arranged in the row direction constitute one page. For example, memory cells coupled to the first word line WL1 in the cell strings CS11 to CS1*m* of the first row constitute one page. Memory cells coupled to the first word line WL1 of the cell strings CS21 to CS2*m* in the second row constitute another page. As any one of the drain select lines DSL1 and DSL2 is selected, cell strings arranged in one row direction may be selected. As any one of the word lines WL1 to WLn is selected, one page may be selected in the selected cell strings.

Figure 5:
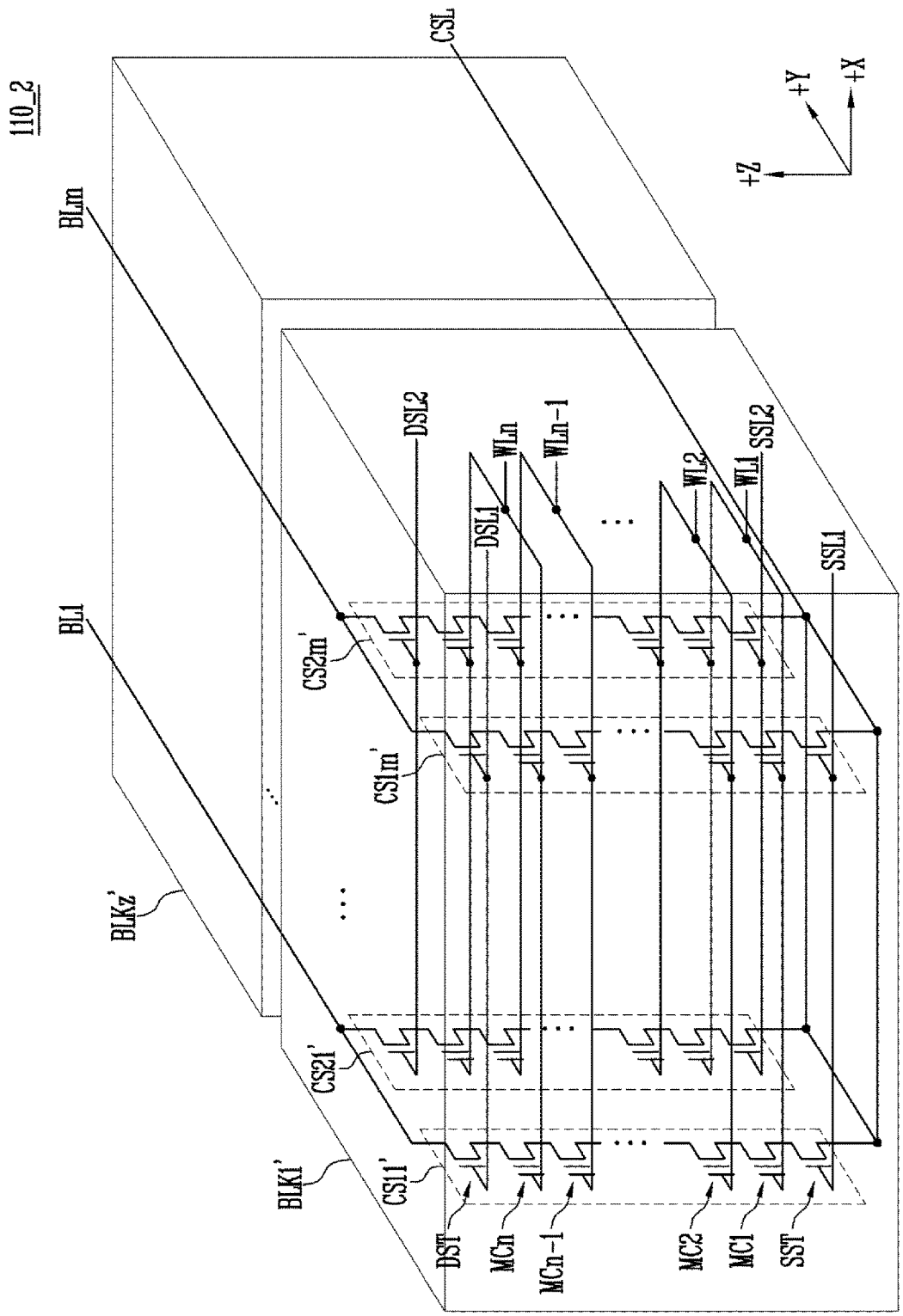
FIG. 5 is a diagram illustrating another embodiment of the memory cell array of FIG. 2.

FIG. 5 is a diagram illustrating another embodiment 110_2 of the memory cell array 110 of FIG. 2.

Referring to FIG. 5, the memory cell array 110_2 includes a plurality of memory blocks BLK1' to BLKz'. In FIG. 5, for convenience of description, an internal configuration of a first memory block BLK1' is illustrated, and internal configurations of the other memory blocks BLK2' to BLKz' are omitted. It will be understood that second to zth memory blocks BLK2' to BLKz' may be configured identically to the first memory block BLK1'.

The first memory block BLK1' includes a plurality of cell strings CS11' to CS1*m*' and CS21' to CS2*m*'. Each of the plurality of cell strings CS11' to CS1*m*' and CS21' to CS2*m*' extends along the +Z direction. In the first memory block BLK1', m cell strings are arranged in the +X direction.

Each of the plurality of cell strings CS11' to CS1$m$' and CS21' to CS2$m$' includes at least one source select transistor SST, first to nth memory cells MC1 to MCn, and at least one drain select transistor DST, which are stacked on a substrate (not shown) under the memory block BLK1'. In FIG. 5, it is illustrated that two cell strings are arranged in the +Y direction. However, this is for convenience of description, and it will be understood that three or more cell strings may be arranged in the column direction.

Each of the plurality of cell strings CS11' to CS1$m$' and CS21' to CS2$m$' includes at least one source select transistor SST, first to nth memory cells MC1 to MCn, and at least one drain select transistor DST.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1$m$' arranged in a first row are coupled to a first source select line SSL1. Source select transistors of the cell strings CS21' to CS2$m$' arranged in a second row are coupled to a second source select line SSL2. In another embodiment, the source select transistors of the cell strings CS11' to CS1$m$' and CS21' to CS2$m$' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in a row direction are coupled to a drain select line extending in the row direction. The drain select transistors of the cell strings CS11' to CS1$m$' in the first row are coupled to a first drain select line DSL1. The drain select transistors of the cell strings CS21' to CS2$m$' in the second row are coupled to a second drain select line DSL2.

Consequently, the memory block BLK1' of FIG. 5 has an equivalent circuit similar to that of the memory block BLK1 of FIG. 4, except that the pipe transistor PT is excluded from each cell string.

Figure 6:
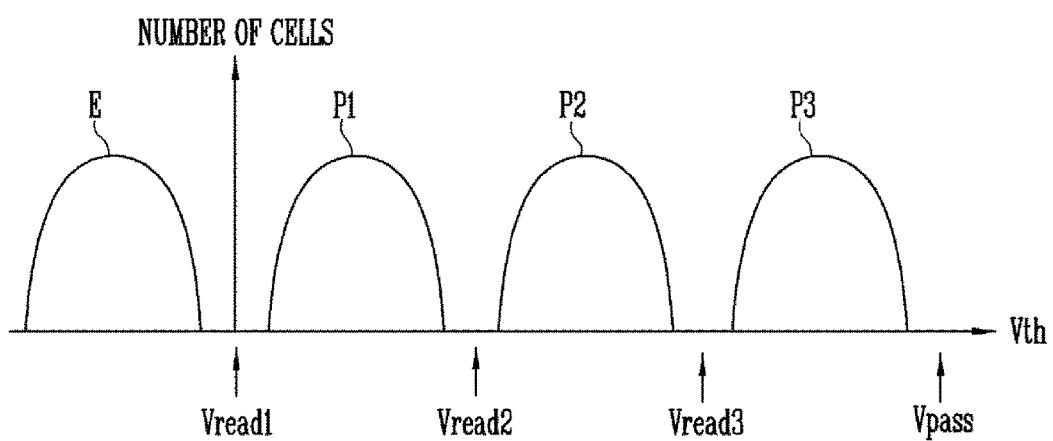
FIG. 6 is a diagram illustrating a threshold voltage distribution of a multi-level cell.
Figure 7:
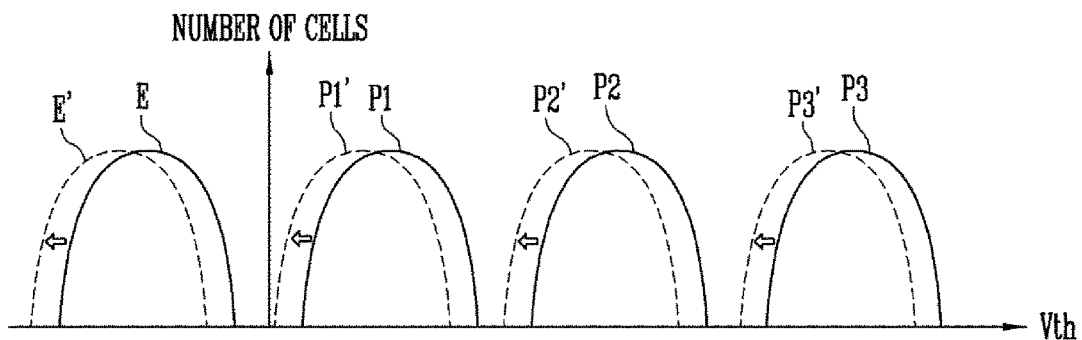
FIG. 7 is a diagram illustrating a change in threshold voltage distribution according to a retention characteristic of a memory cell.

FIG. 6 is a diagram illustrating a threshold voltage distribution of a multi-level cell. FIG. 7 is a diagram illustrating a change in threshold voltage distribution according to retention characteristics of a memory cell.

First, referring to FIG. 6, threshold voltages corresponding to an erase state E are distributed, and threshold voltages corresponding to first to third program states P1 to P3 are distributed. That is, memory cells of which a program operation is completed in the memory cell array have threshold voltage distributions as shown in FIG. 6. As for each threshold voltage distribution, a read operation is performed by applying a read voltage Vread1, Vread2, or Vread3 to a word line coupled to a memory cell selected in a read operation and applying a pass voltage Vpass to a word line coupled to an unselected memory cell.

The threshold voltage distributions of the memory cells of which a program operation is completed may be changed as shown in FIG. 7 as time elapses. As described above, electrons trapped in the charge storage layer of each memory cell may be released to a channel region beyond the charge storage layer as time elapses. As the number of electrons trapped in the charge storage layer decreases, the threshold voltage of the corresponding memory cell also decreases. Due to such a retention characteristic of the memory cell, the threshold voltage distributions may be changed as shown in FIG. 7. That is, the distribution of the threshold voltages corresponding to the erase state E is changed to a state E', and the distributions of the threshold voltages corresponding to the first to third program states P1 to P3 may also be changed to states P1' to P3'. Accordingly, a read error occurs in the read operation, and therefore, the operational reliability of the semiconductor memory device may deteriorate.

The controller 200 according to the present disclosure controls the semiconductor memory device 100 to perform a dummy read operation for every certain time, so that it is possible to prevent degradation caused by threshold voltage distributions shown in FIG. 7. A dummy read operation of the semiconductor memory device under control of the controller 200 according to the present disclosure will be described in more detail later with reference to FIGS. 8 to 15.

Figure 8:
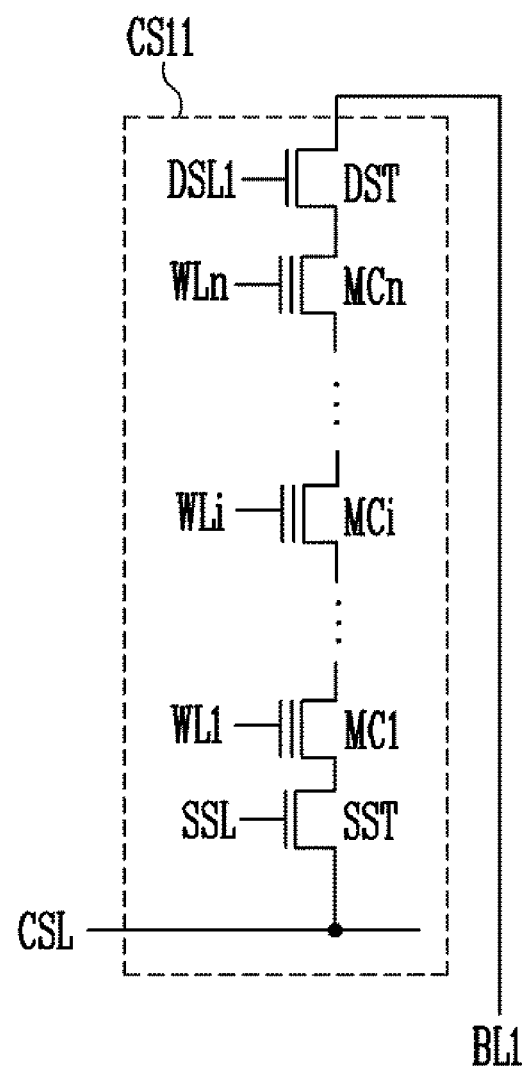
FIG. 8 is a diagram illustrating any one of cell strings shown in FIG. 4.
Figure 9:
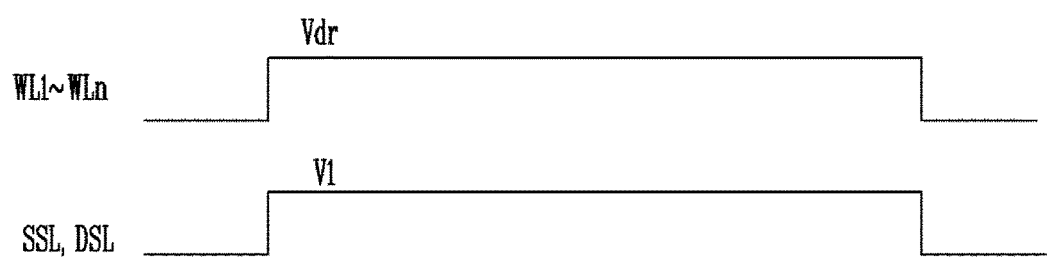
FIG. 9 is a timing diagram illustrating an example of a dummy read operation performed on the cell string of FIG. 8.
Figure 10:
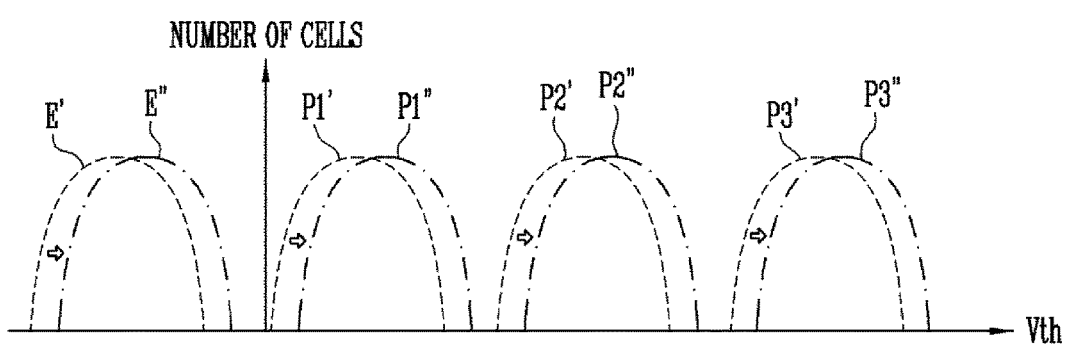
FIG. 10 is a diagram illustrating a change in threshold voltage distribution according to the dummy read operation.

FIG. 8 is one diagram illustrating any one of the cell strings shown in FIG. 4. FIG. 9 is a timing diagram illustrating an example of a dummy read operation performed on the cell string of FIG. 8. FIG. 10 is a diagram illustrating a change in threshold voltage distribution according to the dummy read operation.

In FIG. 8, only a selected cell string CS11 between the cell strings CS11 and CS21 is illustrated for convenience of description. Meanwhile, it is assumed that memory cells MC1 to MCn shown in FIG. 8 are memory cells of which a program operation is completed. As described above, the memory cells MC1 to MCn of which a program operation is completed have threshold voltage distributions as shown in FIG. 6. After that, as time elapses, the threshold voltage distributions of the memory cells MC1 to MCn of which a program operation is completed may be changed as shown in FIG. 7. The controller 200 according to an embodiment of the present disclosure determines an output period of a dummy read command, based on a temperature of the semiconductor memory device 100, and accordingly transmits the dummy read command to the semiconductor memory device 100. The semiconductor memory device 100 performs a dummy read operation on all memory blocks or some memory blocks of the memory cell array 110, based on the output dummy read command. When the semiconductor memory device 100 performs the dummy read operation on a memory block including the cell string CS11 of FIG. 8, a dummy read voltage Vdr is applied to the word lines WL1 to WLn coupled to a corresponding memory block as shown in FIG. 9. Meanwhile, in order to perform the dummy read operation, a voltage V1 may be applied to the source select line SSL and the drain select line DSL. The voltage V1 is a voltage that enables the source select transistor SST and the drain select transistor DST to be turned on. However, the dummy read operation is not an operation for actually reading data stored in the memory cells MC1 to MCn. Therefore, in some embodiments, the source select transistor SST and the drain select transistor DST may be turned off. In this case, a voltage of 0V may be applied to the source select line SSL and the drain select line DSL.

Because the dummy read voltage Vdr is applied to all of the word lines WL1 to WLn, potentials of gate terminals of the memory cells MC1 to MCn may increase. As the gate terminal potentials of the memory cells MC1 to MCn increase, electrons stored in the charge storage layers of the corresponding memory cells MC1 to MCn are prevented from being released to the channel region. Alternatively, some stored electrons that were slightly moved toward the channel region may be moved again toward the gate terminals. As described above, as the dummy read voltage Vdr is applied to the word lines WL1 to WLn, the threshold voltage distributions may be changed as shown in FIG. 10. The dummy read voltage Vdr may be a relatively high voltage such that the threshold voltage distributions are changed as shown in FIG. 10. For example, the dummy read voltage Vdr may have a voltage value equal to that of the pass voltage Vpass shown in FIG. 6. In another embodiment, the dummy read voltage Vdr may have a voltage value larger than that of the pass voltage Vpass of FIG. 6. The voltage value of the dummy read voltage Vdr may be variously determined, if necessary.

That is, the dummy read operation is performed in a situation in which the threshold voltages of the memory cells MC1 to MCn have been changed as shown in FIG. 7 according to retention characteristics or while threshold voltages of the memory cells MC1 to MCn are being changed as shown in FIG. 7. Accordingly, as shown in FIG. 10, the distribution of threshold voltages corresponding to the erase state E' is changed to a state E", and the distributions of threshold voltages corresponding to the first to third program states P1' to P3' are changed to states P1" to P3". Consequently, a change in threshold voltage of the memory cells according to the retention characteristics is compensated, and accordingly, the operational reliability of the semiconductor memory device is improved.

The above-described dummy read operation may be performed on all of the memory blocks included in the memory cell array 110. In this case, the dummy read voltage Vdr may be applied to all word lines WL1 to WLn coupled to a corresponding memory block, sequentially from the memory block BLK1 to the block BLKz. In another embodiment, the dummy read operation may be performed by a dummy read command and may be performed on some of the memory blocks included in the memory cell array 110. In this case, the dummy read voltage Vdr may be applied to all word lines WL1 to WLn coupled to a corresponding memory block, sequentially with respect to the selected memory blocks.

Figure 11:
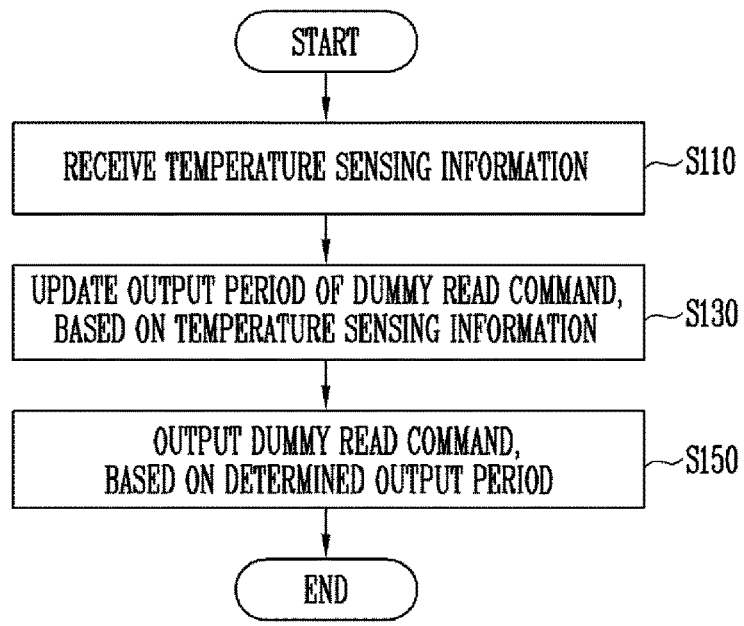
FIG. 11 is a flowchart illustrating an operating method of a controller according to an embodiment of the present disclosure.

FIG. 11 is a flowchart illustrating an operating method of a controller according to an embodiment of the present disclosure.

Referring to FIG. 11, the operating method of the controller that controls an operation of the semiconductor memory device 100 includes step S110 of receiving temperature sensing information from the semiconductor memory device 100 and step S130 of updating an output period of a dummy read command, based on the received temperature sensing information. In some embodiments, the operating method of the controller may further include step S150 of outputting the dummy read command, based on the determined output period. The dummy read command (S150) is transmitted to the semiconductor memory device 100, to perform the dummy read operation described with reference to FIGS. 8 to 10.

In step S110, temperature sensing information sensed by the temperature sensing unit 210 is received from the semiconductor memory device 100. The temperature sensing information may be information indicating a temperature of the semiconductor memory device 100. More specifically, the temperature sensing information may be information indicating a temperature of the memory cell array 110. As shown in FIG. 1, the temperature sensing information may be transmitted to the period storage unit 230.

In the step S130, the output period of the dummy read command is updated based on the received temperature sensing information. To this end, a lookup table that stores information shown in the above-described Table 1 may be used. The period storage unit 230 may update a current output period with any one of output periods T1 to T7 by comparing the received temperature sensing information with temperature ranges stored in the lookup table. As described above, in the step S130, an output period that becomes shorter as the temperature indicated by the temperature sensing information of the memory cell array 110 increases may be updated as the current output period. Accordingly, as the temperature of the memory cell array 110 increases, the dummy read command may be more frequently generated.

In the step S150, the dummy read command is output to the semiconductor memory device 100 based on the determined output period. A more detailed description of step S150 will be described with reference to FIG. 12.

Figure 12:
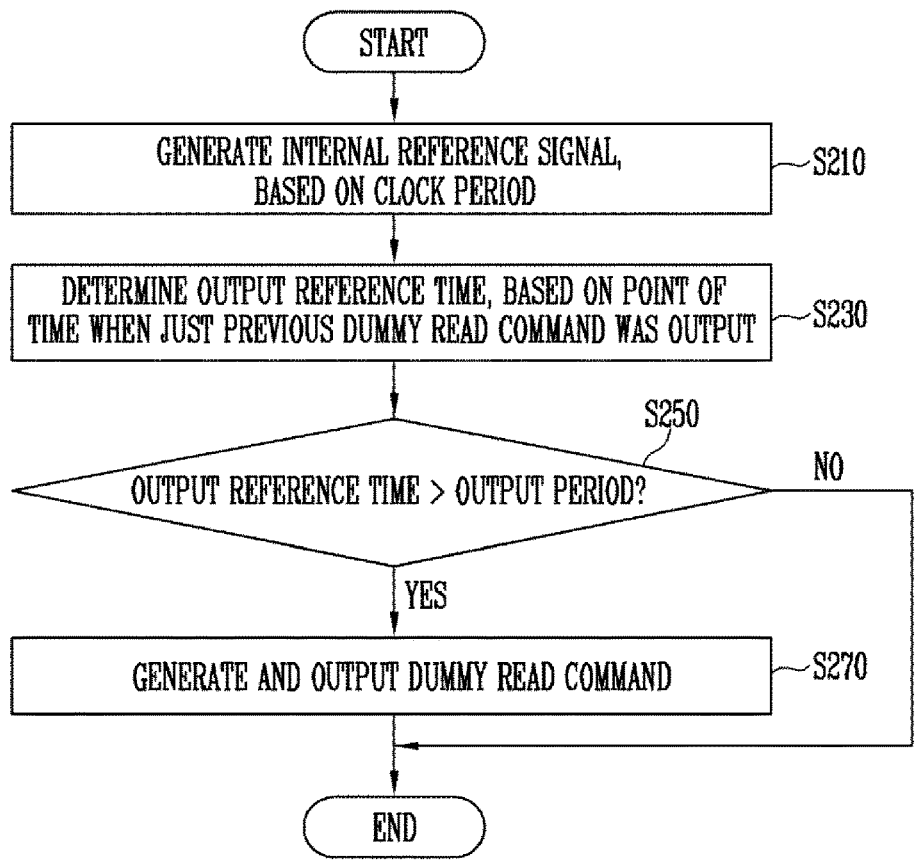
FIG. 12 is a flowchart illustrating in more detail an example of a step of outputting a dummy read command, which is shown in FIG. 11.

FIG. 12 is a flowchart illustrating in more detail an example of the step of outputting the dummy read command, which is shown in FIG. 11.

Referring to FIG. 12, first, an internal reference signal is generated based on a clock period (S210). The internal reference signal is a signal that is periodically generated according to the clock period. The internal reference signal may be a trigger signal that causes an operation for determining whether to generate the dummy read command. That is, whenever the internal reference signal is generated, steps S230 to S270 may be performed.

If the internal reference signal is generated, the output reference time is determined in response to the internal reference signal (S230). In the step S230, the output reference time is determined based on a time that a preceding dummy read command was output. More specifically, the output reference time may indicate a period between the time that the preceding dummy read command was output and the current time, where the current time is the time when the internal reference signal is generated. That is, whenever the internal reference signal is generated, the output reference time may increase. In other words, the output reference time indicates a difference in the time between the time when the preceding dummy read command was output and the current time.

In step S250, the output period is compared with the determined output reference time. The output period is the output period of the dummy read command, which was updated based on the temperature sensing information in step S130 of FIG. 11. That the output reference time exceeds the output period means that time has gone beyond the allotted output period. That is, the output reference time may be greater than the output period. Therefore, when the output reference time exceeds the output period, the operating method proceeds to step S270 to generate a dummy read command and output the dummy read command to the semiconductor memory device. Although not shown in FIG. 12, the time that the preceding dummy read command was output may be updated as the current time in the step S270.

That the output reference time does not exceed the output period means that time has not gone beyond the allotted output period. That is, the output reference time is not greater than the output period. Therefore, when the output reference time does not exceed the output period, the operating method ends. Accordingly, the dummy read command is not generated until a next internal reference signal is generated.

As shown in FIG. 12, the command generating unit 250 periodically generates the dummy read command, based on an updated output period. Because the output period is set based on the temperature of the semiconductor memory device 100, the command generating unit 250 also generates the dummy read command, based on the temperature of the semiconductor memory device 100. Accordingly, the dummy read operation can be performed according to the temperature of the semiconductor memory device 100. Consequently, the operational performance of the semiconductor memory device 100 can be improved by compensating for retention characteristics of memory cells in the semiconductor memory device 100.

Figure 13:
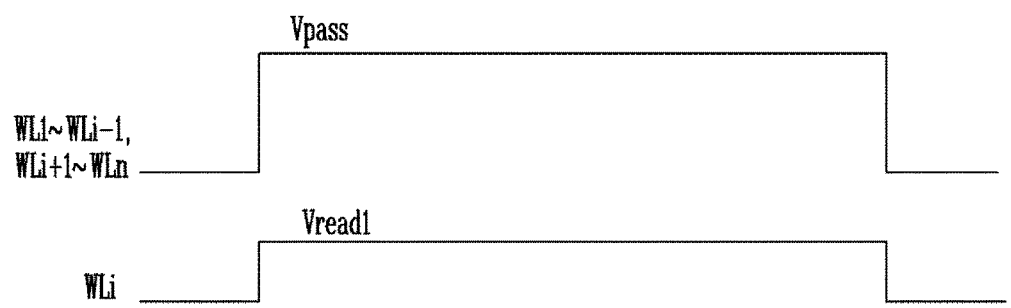
FIG. 13 is a timing diagram illustrating another example of the dummy read operation performed on the cell string of FIG. 8.

FIG. 13 is a timing diagram illustrating another example of the dummy read operation performed on the cell string of FIG. 8.

When comparing FIGS. 9 and 13, the dummy read voltage Vdr is applied to all of the word lines WL1 to WLn in FIG. 9. On the other hand, in FIG. 13, a read voltage Vread1 is applied to a selected word line WLi, and a read pass voltage Vpass is applied to unselected word lines WL1 to WLi−1 and WLi+1 to WLn.

A separate dummy read command for applying the dummy read voltage Vdr to all word lines coupled to a memory block is required to perform the dummy read operation as shown in the embodiment of FIG. 9. The separate dummy read command is different from a general read command, and the semiconductor memory device 100 is to be controlled such that an internal operation corresponding to the separate dummy read command can be performed. This means that design of a circuit for performing an additional dummy read operation, etc. should be added.

Meanwhile, in the embodiment of FIG. 13, a general read command is transmitted as the dummy read command to the semiconductor memory device 100. To this end, an address for a read operation may also be transmitted to the semiconductor memory device 100. The semiconductor memory device 100 applies the read voltage Vread1 to a word line WLi corresponding to the address, in response to the read command, and applies the read pass voltage Vpass to all the other word lines WL1 to WLi−1 and WLi+1 to WLn coupled to at least one memory block BLK1 to BLKz. In FIG. 13, it is illustrated that only the read voltage Vread1 is applied, but other read voltages Vread2 and Vread3 may also be applied in a subsequent period.

In the embodiment of FIG. 13, the controller may use a general read command as the dummy read command. In this case, the semiconductor memory device 100 performs a read operation according to the general read command, and it is unnecessary to perform an operation for a separate dummy read command. Therefore, unlike the embodiment shown in FIG. 9, it is unnecessary that the design of a circuit for performing an additional dummy read operation, etc. should be added. Meanwhile, data may be output from the semiconductor memory device 100 to the controller 200 through a read operation shown in FIG. 13. However, because the read operation is performed as the dummy read operation, the controller 200 may discard or neglect the received data.

The dummy read operation shown in FIG. 13 may be performed on all of the memory blocks included in the memory cell array 110. In this case, the controller 200 may sequentially output read commands corresponding to the memory blocks BLK1 to BLKz to the semiconductor memory device 100. At this time, an address corresponding to an arbitrary word line WLi in a corresponding memory block may be output together with a read command. The semiconductor memory device 100 sequentially performs a read operation corresponding to each of the received read commands and addresses. Accordingly, the dummy read operation may be performed based on the dummy read command on all of the memory blocks BLK1 to BLKz included in the semiconductor memory device 100.

In another embodiment, the dummy read operation may be performed on some of the memory blocks included in the memory cell array 110. In this case, the controller 200 may sequentially output a read command to the semiconductor memory device 100 for some of the memory blocks on which the dummy read operation is to be performed. The semiconductor memory device 100 sequentially performs a read operation corresponding to each of the received read commands and addresses. Accordingly, the dummy read operation can be performed on some of the memory blocks BLK1 to BLKz.

Figure 14:
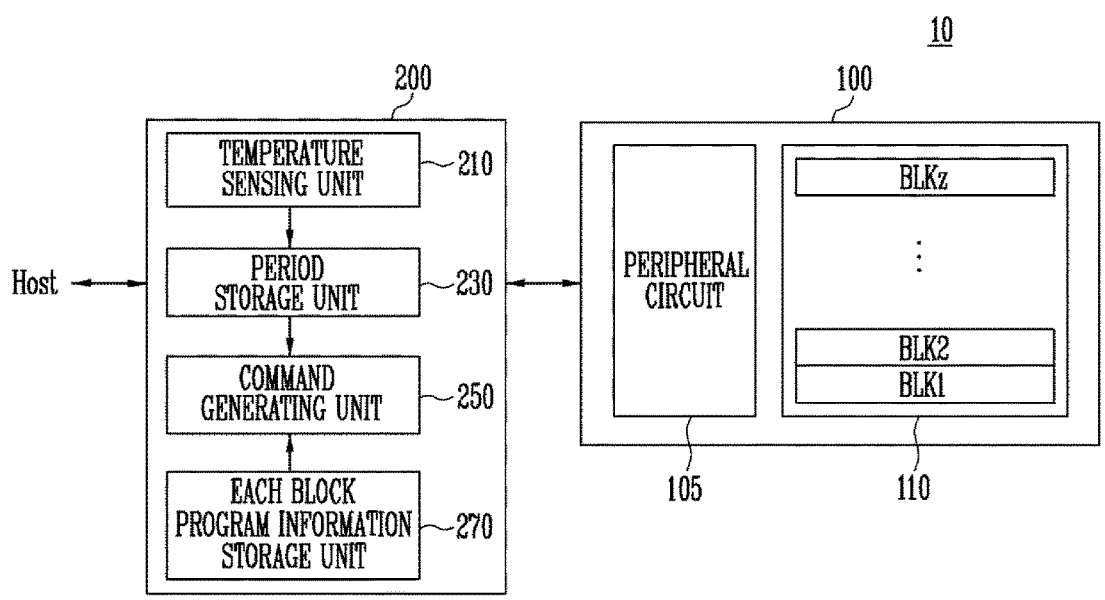
FIG. 14 is a block diagram illustrating a memory system including a controller and a semiconductor memory device according to another embodiment of the present disclosure.

FIG. 14 is a block diagram illustrating a memory system including a controller and a semiconductor memory device according to another embodiment of the present disclosure.

The memory system of FIG. 14 is similar to the memory system of FIG. 1. Therefore, descriptions of overlapping components will be omitted. When compared with FIG. 1, the controller of FIG. 14 additionally includes an each block program information storage unit 270. The each block program information storage unit 270 may store information on a time when a program operation is performed on a corresponding memory block with respect to each of the memory blocks BLK1 to BLKz in the memory cell array 110. In an example embodiment, the each block program information storage unit 270 may include a lookup table that stores information as shown in the following Table 2.

TABLE 2

| Block | Time of program |
|---|---|
| BLK1 | TP1 |
| BLK2 | TP2 |
| BLK3 | Unprogrammed |
| BLK4 | TP4 |
| ... | ... |
| BLKz | TPz |

As shown in Table 2, a time when each of the memory blocks BLK1 to BLKz is programmed and information on an unprogrammed block (e.g., BLK3) may be stored. The command generating unit 250 may generate a dummy read command, based on the time when each memory block is programmed, in addition to an output period based on temperature sensing information. A step of outputting, by the command generating unit 250, the dummy read command in FIG. 14 will be described later with reference to FIG. 15.

Figure 15:
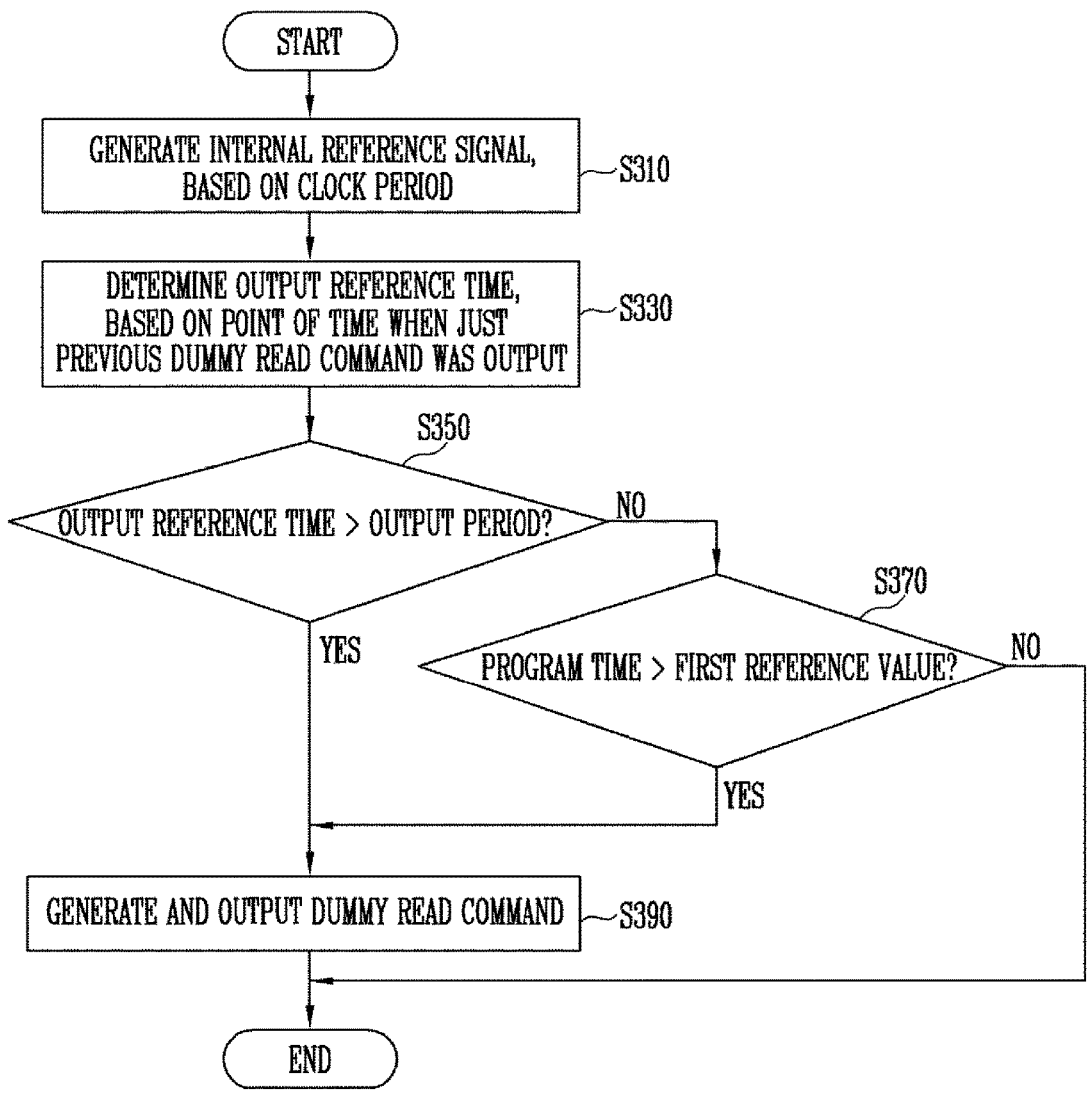
FIG. 15 is a flowchart illustrating in more detail another example of the step of outputting the dummy read command, which is shown in FIG. 11.

FIG. 15 is a flowchart illustrating in more detail another example of the step of outputting the dummy read command, which is shown in FIG. 11.

Referring to FIG. 15, first, an internal reference signal is generated based on a clock period (S310). If the internal reference signal is generated, an output reference time is determined based on a time when a preceding dummy read command was output (S330). In step S350, the determined output reference time is compared with the output period. When the output reference time exceeds the output period, the operating method proceeds to step S390 to generate a dummy read command and output the dummy read command to the semiconductor memory device. The above-described processes are identical to those described with the flowchart shown in FIG. 12, and therefore, their detailed descriptions will be omitted. Specifically, steps S310, S330, and S350 of FIG. 15 are substantially identical to those S210, S230, and S250 of FIG. 12. In addition, the step S390 of FIG. 15 is substantially identical to that S270 of FIG. 12.

The flowchart of FIG. 15 is different from that of FIG. 12 in that the flowchart of FIG. 15 includes step S370 of determining whether a program time exceeds a predetermined first reference value when the output reference time does not exceed the output period in the step S350.

In the step S370, the "program time" means a period from a time when a memory block is programmed to a current time. For example, when the current time is designated by Tpr, the program time of the first memory block BLK1 is a value determined as "Tpr to Tp1." Similarly, the program time of the second memory block BLK2 is a value determined as "Tpr to Tp2." The first reference value may be a predetermined reference value for determining whether the dummy read command is to be generated based on the program time.

Although the output reference time does not exceed the output period in the step S350, there may be a case where the dummy read operation is required because a corresponding memory block has not been programmed for a long time. Therefore, in the step S370, when the program time exceeds the first reference value even though the output period according to the temperature has not yet come again, the command generating unit 250 generates a dummy read command for a dummy read of a corresponding memory block because the corresponding memory block has not been programmed for a long time. In Table 2, the third memory block BLK3 is not programmed. In this case, the dummy read command is not generated. That is, the step S370 and the subsequent step S390 may be individually performed for every memory block.

As shown in FIG. 15, the command generating unit 250 periodically generates the dummy read command, based on the updated output period. In this case, the command generating unit 250 generates the dummy read command for a memory block that has not been programmed for a long time even though the output period has not come again. Accordingly, the dummy read operation according to the temperature can be performed, and the dummy read operation according to the time when each memory block is programmed can be additionally performed. Consequently, the operational performance of the semiconductor memory device 100 can be improved.

Figure 16:
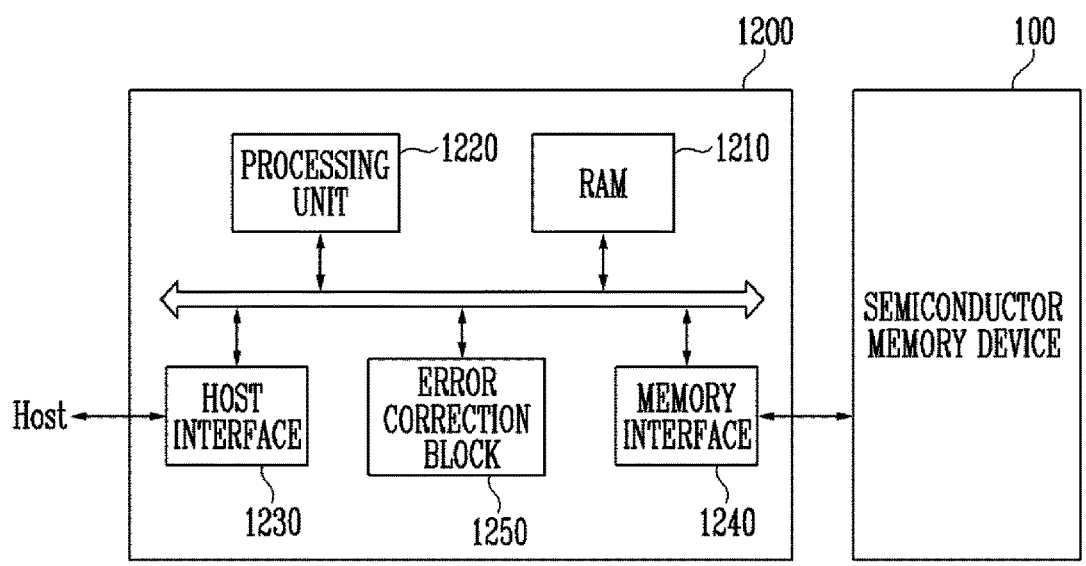
FIG. 16 is a block diagram illustrating a memory system including the semiconductor memory device of FIG. 1.

FIG. 16 is a block diagram illustrating a memory system 1000 including the semiconductor memory device 100 of FIG. 1.

Referring to FIG. 16, the memory system 1000 includes a semiconductor memory device 100 and the controller 1100.

The semiconductor memory device 100 may be configured and operated as described with reference to FIGS. 1 to 15. Hereinafter, overlapping descriptions will be omitted.

The controller 1200 is coupled to a host Host and the semiconductor memory device 100. The controller 1200 is configured to access the semiconductor memory device 100 in response to a request from the host Host. For example, the controller 1200 is configured to control read, write, erase, and background operations of the semiconductor memory device 100. The controller 1200 is configured to provide an interface between the semiconductor memory device 100 and the host Host. The controller 1200 is configured to drive firmware for controlling the semiconductor memory device 100.

The controller 1200 includes a random access memory (RAM) 1210, a processing unit 1220, a host interface 1230, a memory interface 1240, and an error correction block 1250. The RAM 1210 is used for at least one of an operation memory of the processing unit 1220, a cache memory between the semiconductor memory device 100 and the host Host, and a buffer memory between the semiconductor memory device 100 and the host Host. The processing unit 1220 controls overall operations of the controller 1200.

The host interface 1230 includes a protocol for exchanging data between the host Host and the controller 1200. In an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 interfaces with the semiconductor memory device 100. For example, the memory interface 1240 may include a NAND interface or a NOR interface.

The error correction block 1250 is configured to detect and correct an error of data received from the semiconductor memory device 100 by using an error correction code (ECC).

The controller 1200 and the semiconductor memory device 100 may be integrated into one semiconductor device. In an example embodiment, the controller 1200 and the semiconductor memory device 100 may be integrated into one semiconductor device, to constitute a memory card. For example, the controller 1200 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1200 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telemetics network, an RFID device, or one of various components that constitute a computing system.

In an example embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 17:
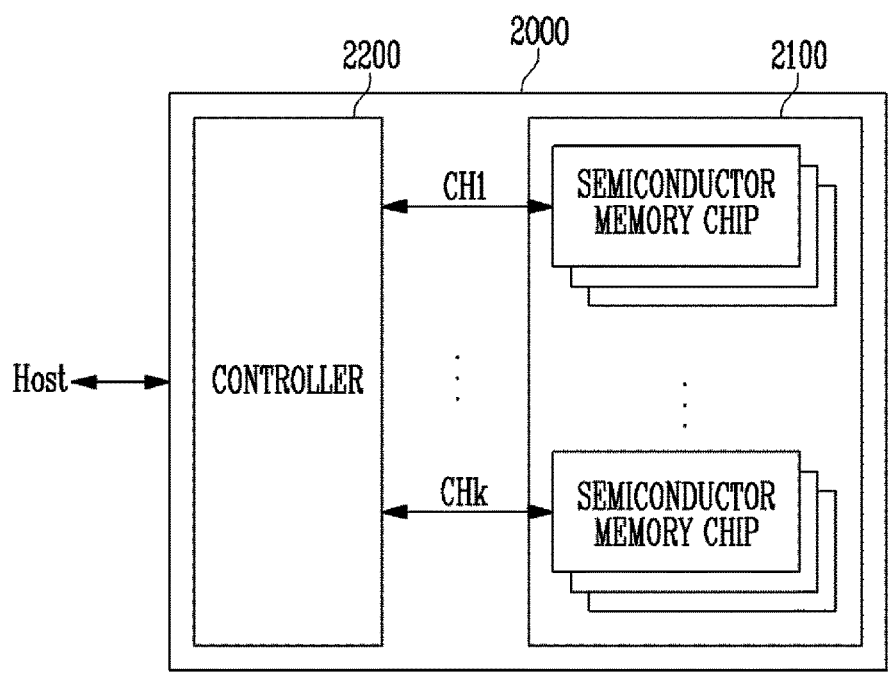
FIG. 17 is a block diagram illustrating an application example of the memory system of FIG. 16.

FIG. 17 is a block diagram illustrating an application example 2000 of the memory system 1000 of FIG. 16.

Referring to FIG. 17, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 17, it is illustrated that the plurality of groups communicate with the controller 2200 through first to kth channels CH1 to CHk. Each semiconductor memory chip may be configured and operated identically to the semiconductor memory device 100 described with reference to FIG. 1.

Each group is configured to communicate with the controller 2200 through one common channel. The controller 2200 is configured similarly to the controller 1200 described with reference to FIG. 16. The controller 2200 is configured to control the plurality of memory chips of the semiconductor memory device 2100 through the plurality of channels CH1 to CHk.

In FIG. 17, it has been illustrated that a plurality of semiconductor memory chips are coupled to one channel. However, it will be understood that the memory system 2000 may be modified such that one semiconductor memory chip is coupled to one channel.

Figure 18:
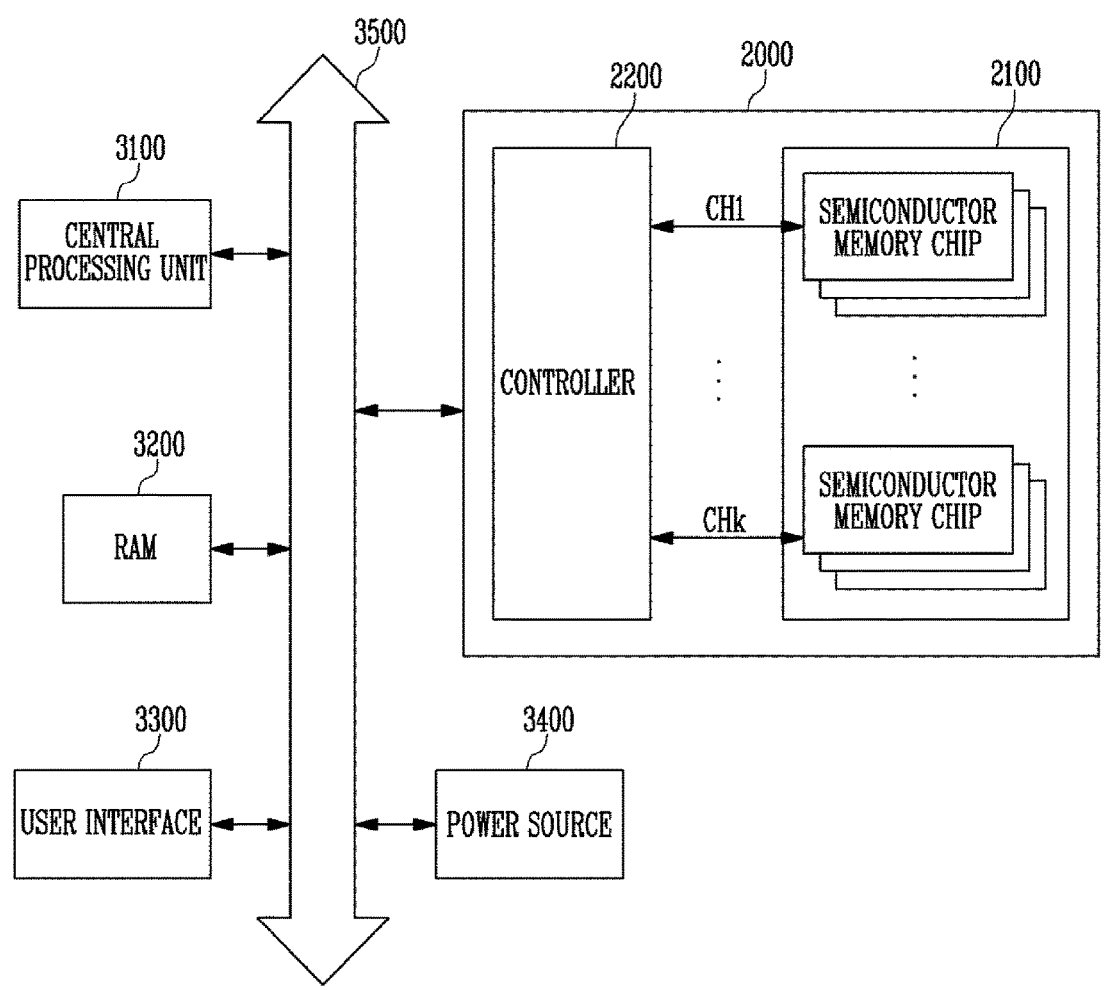
FIG. 18 is a block diagram illustrating a computing system including the memory system described with reference to FIG. 17.

FIG. 18 is a block diagram illustrating a computing system 3000 including the memory system 2000 described with reference to FIG. 17.

Referring to FIG. 18, the computing system 3000 includes a central processing unit 3100, a RAM 3200, a user interface 3300, a power source 3400, a system bus 3500, and the memory system 2000.

The memory system 2000 is electrically coupled to the central processing unit 3100, the RAM 3200, the user interface 3300, and the power source 3400 through the system bus 3500. Data supplied through the user interface 3300 or data processed by the central processing unit 3100 are stored in the memory system 2000.

In FIG. 18, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 18, it is illustrated that the memory system 2000 described with reference to FIG. 17 is provided. However, the memory system 2000 may be replaced by the memory system 1000 described with reference to FIG. 16. In an embodiment, the computing system 3000 may be configured to include both the memory systems 1000 and 2000 described with reference to FIGS. 16 and 17.

According to the present disclosure, it is possible to provide a controller capable of improving the operational reliability of a semiconductor memory device.

Further, according to the present disclosure, it is possible to provide an operating method of a controller capable of improving the operational reliability of a semiconductor memory device.

Example embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and detail may be made without departing from the spirit and scope of the present disclosure as set forth in the following claims.

What is claimed is:

1. A controller that controls an operation of a semiconductor memory device including a plurality of memory blocks, the controller comprising:
 a temperature sensing unit configured to generate temperature information by sensing a temperature of the semiconductor memory device;
 a period storage unit configured to update an output period of a dummy read command that allows the semiconductor memory device to perform a dummy read operation, based on the temperature information; and
 a command generating unit configured to generate the dummy read command, based on the output period.

2. The controller of claim 1, wherein the period storage unit includes a lookup table that includes an output period corresponding to each temperature range,
 wherein the period storage unit updates a currently applied output period with reference to the lookup table.

3. The controller of claim 1, wherein, as the temperature measured by the temperature sensing unit increases, the period storage unit updates a shorter period as the output period.

4. The controller of claim 1, wherein the command generating unit generates the dummy read command by comparing an output reference time with the output period, where the output reference time indicates a period between a time when a preceding dummy read command was generated and a current time.

5. The controller of claim 4, wherein, when the output reference time exceeds the output period, the command generating unit generates the dummy read command.

6. The controller of claim 5, further comprising an each block program information storage unit configured to store information on a time when at least one memory block among the plurality of memory blocks is programmed,
 wherein, when the output reference time does not exceed the output period, the command generating unit generates the dummy read command by comparing a program time indicating a period between a time when the memory block is programmed and a current time with a predetermined first reference value.

7. The controller of claim 6, wherein, when the program time exceeds the first reference value, the command generating unit generates a dummy read command for a dummy read of the memory block.

8. The controller of claim 1, wherein a dummy read operation is performed based on the dummy read command on all of the memory blocks included in the semiconductor memory device.

9. The controller of claim 1, wherein a dummy read operation may be performed based on the dummy read command on some memory blocks among the memory blocks included in the semiconductor memory device.

10. The controller of claim 1, wherein a read pass voltage is applied to all word lines coupled to at least one memory block among the plurality of memory blocks by the dummy read command.

11. The controller of claim 1, wherein a read voltage is applied to a selected word line among all word lines coupled to at least one memory block among the plurality of memory blocks by the dummy read command, and a read pass voltage is applied to the other unselected word lines.

12. A method for operating a controller that controls an operation of a semiconductor memory device including a plurality of memory blocks, the method comprising:
   receiving temperature sensing information indicating a temperature of the semiconductor memory device; and
   updating an output period of a dummy read command for performing a dummy read operation of the semiconductor memory device, based on the temperature sensing information.

13. The method of claim 12, wherein, in the updating of the output period of the dummy read command, a shorter period is updated as the output period as the temperature indicated by the temperature sensing information increases.

14. The method of claim 12, wherein the dummy read command is a command for performing a dummy read operation on all of the plurality of memory blocks.

15. The method of claim 12, wherein the dummy read command is a command for performing a dummy read operation on some of the plurality of memory blocks.

16. The method of claim 12, further comprising outputting the dummy read command, based on the output period.

17. The method of claim 16, wherein the outputting of the dummy read command includes:
   determining an output reference time indicating a period between a time when a preceding dummy read command was generated and a current time;
   comparing the output reference time with the output period; and
   generating a dummy read command, based on the compared result.

18. The method of claim 17, wherein, in the generating of the dummy read command, based on the compared result, when the output reference time exceeds the output period, the dummy read command is generated.

19. The method of claim 18, wherein, when the output reference time does not exceed the output period, a program time indicating a period between a time when one memory block among the memory blocks is programmed and a current time is compared with a predetermined first reference value, and
   wherein, when the program time exceeds the first reference value, the dummy read command is generated.

\* \* \* \* \*